US011109505B2

(12) United States Patent
Wu et al.

(10) Patent No.: US 11,109,505 B2
(45) Date of Patent: Aug. 31, 2021

(54) LOCATING DEVICE

(71) Applicant: HANWIT PRECISION INDUSTRIES LTD., New Taipei (TW)

(72) Inventors: Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 439 days.

(21) Appl. No.: 16/241,362

(22) Filed: Jan. 7, 2019

(65) Prior Publication Data
US 2019/0394896 A1 Dec. 26, 2019

(30) Foreign Application Priority Data

Jun. 26, 2018 (TW) .................................. 107121932

(51) Int. Cl.
H05K 7/14 (2006.01)
H05K 5/02 (2006.01)
H05K 7/18 (2006.01)

(52) U.S. Cl.
CPC ......... *H05K 7/1489* (2013.01); *H05K 5/0221* (2013.01); *H05K 7/18* (2013.01)

(58) Field of Classification Search
CPC ...................................................... G06F 1/187
See application file for complete search history.

(56) References Cited

U.S. PATENT DOCUMENTS 7,433,183 B2 * 10/2008 Huang .................... G06F 1/187
312/223.2
10,321,597 B2 * 6/2019 Tseng ................... H05K 7/1411

* cited by examiner

*Primary Examiner* — Jerry Wu
(74) *Attorney, Agent, or Firm* — Muncy, Geissler, Olds & Lowe, P.C.

(57) ABSTRACT

A locating device includes a guiding member, a sliding member and a pulling assembly. The guiding member includes a guiding channel inwardly cut through a top thereof, and the sliding member has side plates which each has a locating part. The pulling assembly comprises a pulling body having a guiding element, a fastening element disposed on a side thereof opposite to the guiding element. When the pulling body is in an open state, the fastening element is not located on the locating part; when the pulling body performs a locking operation, the guiding element is slid in the guiding channel and the sliding member is simultaneously slid in another direction opposite to the guiding element; when the pulling body is in a locked state, the fastening element is located on the locating part. Therefore, operational difficulty can be reduced and assembly speed can be improved.

10 Claims, 10 Drawing Sheets

LOCATING DEVICE

This application claims the priority benefit of Taiwan patent application number 107121932, filed on Jun. 26, 2018.

BACKGROUND OF THE INVENTION

1. Field of the Invention

The present invention provides a locating device, more particularly to the locating device including a pulling assembly, and when the pulling assembly is pulled to rotate, a guiding element can be slid in a guiding channel of a guiding member, so as to simultaneously move the sliding member towards another direction opposite to the sliding direction of the guiding element, and after the pulling assembly is pulled and rotated, a fastening element of the pulling assembly can be located on a locating part of the sliding member to form a locked state, thereby reducing operational difficulty and improving assembly speed.

2. Description of the Related Art

With developments of network cloud technology and Internet of Things technology, the requirements for the computer servers and industrial computer servers are rapidly growing. The development trend of the server is mainly toward higher computing power and speed, and smaller size. Computers are usually used to control many electronic devices or apparatuses to operate or perform functions, and are very important devices in industries. In order to process huge data computations, the computer servers and industrial computer servers need a large number and high density of storage medium machines, such as hard drives, CD/DVD players, or burners, to store and read data. Therefore, a large number of storage medium machines are placed inside the host computer chassis, server chassis, the storage or telecommunications cabinet, thereby increasing storage capacity.

Furthermore, since the large number of storage medium machines are placed and located in the general host computer chassis, the server chassis, the storage or telecommunications cabinet, the operation of replacing the storage medium machine must be simpler and faster for a user to perform repair or replacement work on each recording medium machine, and the assembly structure and component manufacturing costs need to be considered in order to meet the great amount of requirements and costs of the storage medium machines. Furthermore, the chassis is usually used for a long-term period, so it is necessary to consider the stability of the overall system and the convenience of repair and replacement, to facilitate the user to operate, thereby reducing the loss of downtime and manpower. However, some of the storage medium machines currently used are fastened and located in the chassis by screw locking manner, and the screws are inserted through holes of the chassis and then locked into the screw holes of the storage medium machine, respectively. The screw locking manner requires a lot of screws, and the screws also must be removed one by one in order to demount the storage medium machine, and it results in a lot of man-hours for assembly, and significantly increased downtime for maintenance. When the chassis is filled with interface cards, storage medium machines, power lines, cables and other devices, it is very inconvenient to insert a tool for locking screw, and the screw possibly falls to lost during the locking operation. Furthermore, if the size of the screw does not match the screw hole but the screw is still locked into the screw hole by force, it is easy to damage the screw hole on the storage medium machine, and it is not convenient for further assembly or disassembly. Since the server chassis is widely used in machine rooms of telecommunication or storage systems and data center, what is needed is to develop a locating device to locate a group of storage medium machines in the server chassis without occupying too much space, and the storage medium machine can be repaired or replaced easily, so that the number of the storage medium machines installed in the machine room can be greatly increased and the user can quickly and easily dismount the storage medium machine for repair and replacement.

SUMMARY OF THE INVENTION

In order to solve aforementioned problems, the inventor develops a locating device according to collected data, multiple tests and modifications, and years of experience in the industry.

An objective of the present invention is to provide a locating device in which a guiding member has a guiding channel inwardly cut through a top thereof, and a base of a sliding member has side plates bent from two opposite sides thereof in the same direction, and each side plate has a locating part disposed thereon, and a pulling assembly comprises a pulling body pivotally connected to the sliding member, and the pulling body has a guiding element, and a fastening element disposed on a side thereof opposite to the guiding element, and when the pulling body of the pulling assembly is in an open state, the fastening element is not located on the locating part, and when the pulling body of the pulling assembly is pulled to rotate, the guiding element can be guided and slid in the guiding channel of the guiding member, to simultaneously move the sliding member in another direction opposite to the sliding direction of the guiding element, and after the pulling body of the pulling assembly is pulled and rotated, the fastening element of the pulling assembly can be located on the locating part of the sliding member to lock the pulling assembly, so that it is not necessary to perform complicated assembly operation using screw to perform locating operation, thereby reducing operational difficulty to achieve purpose of improving assembly speed.

Another objective of the present invention is that when the pulling body of the pulling assembly is pulled to downwardly rotate, the fastening element can be directly located in the locating part of the sliding member to form the locked state, through the elastic element, so that it is not necessary to perform addition fastening operation, thereby achieving the purpose of simple operation and higher assembly speed.

Another objective of the present invention is that when the pulling body of the pulling assembly is in the open state, the pulling body can use supporting surface to abut against the surface of the base of the sliding member, to prevent the pulling body from being excessively pulled to lost support force and further prevent an external combination member from shaking during the assembly process, so that the guiding element of the pulling assembly can be accurately inserted into the guiding channel of the guiding member, thereby achieving purpose of improving accuracy and stability of the assembly process.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
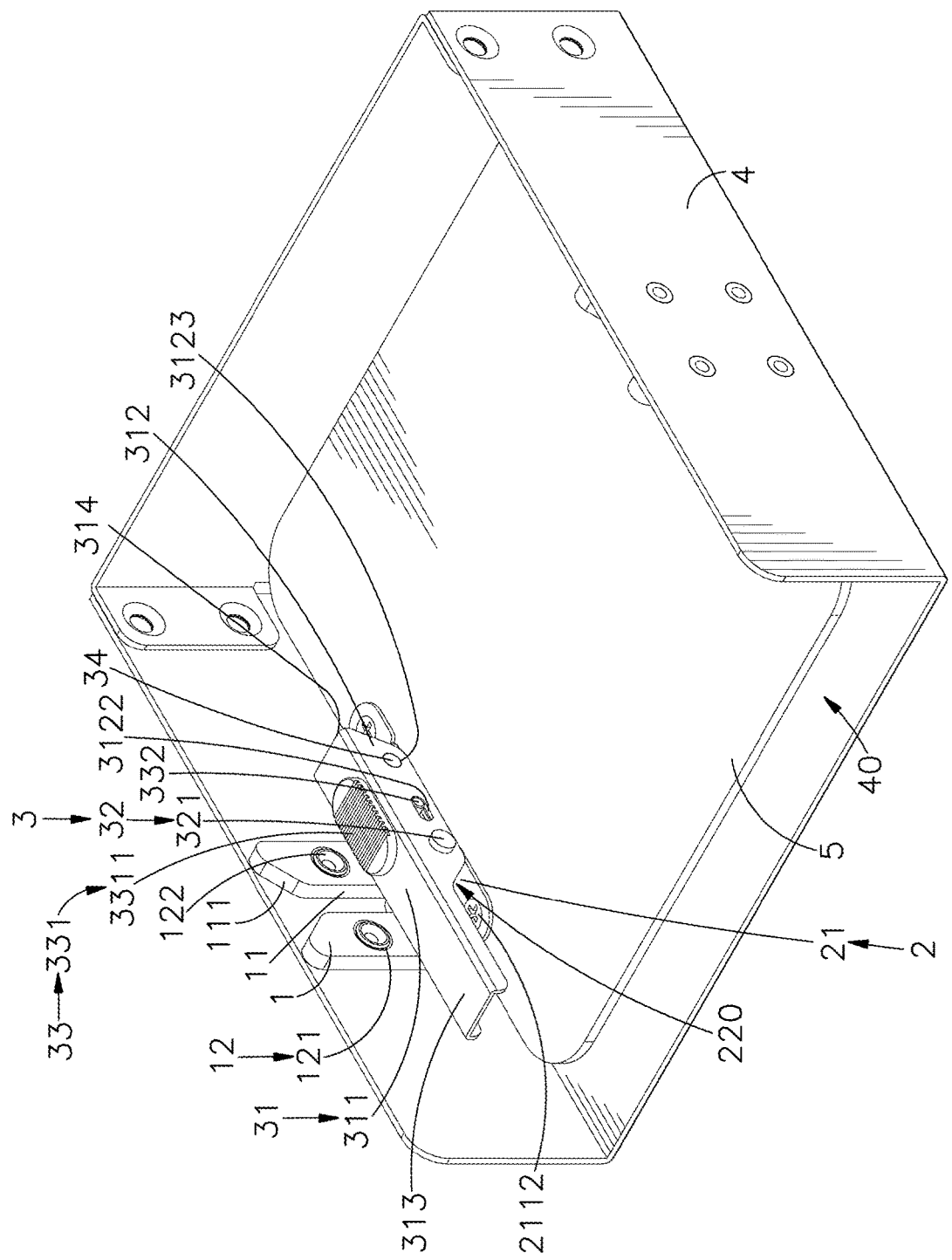
FIG. 1 is an elevational view of a locating device of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 2:
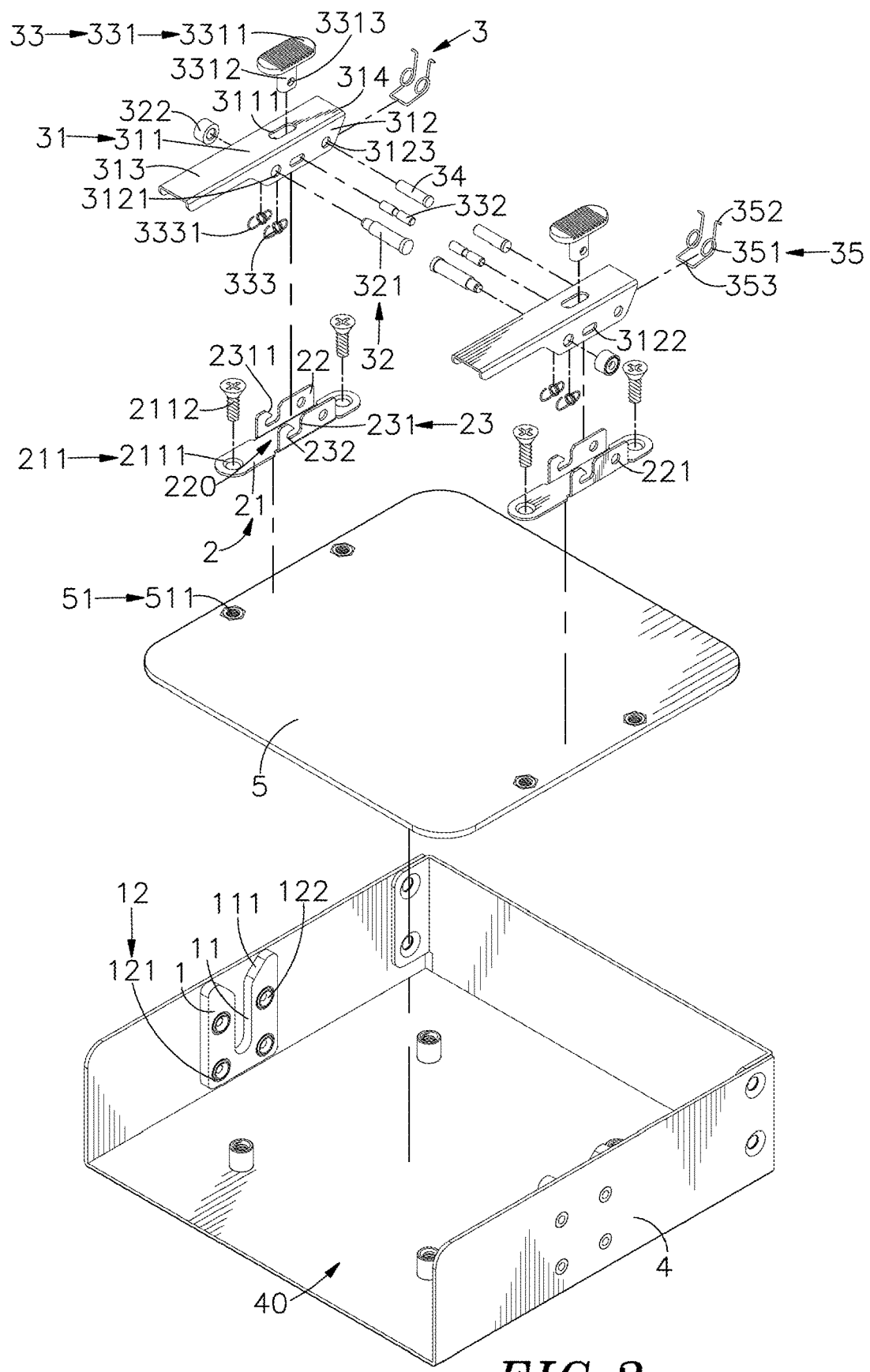
FIG. 2 is an exploded view of a locating device of the present invention.
Figure 3:
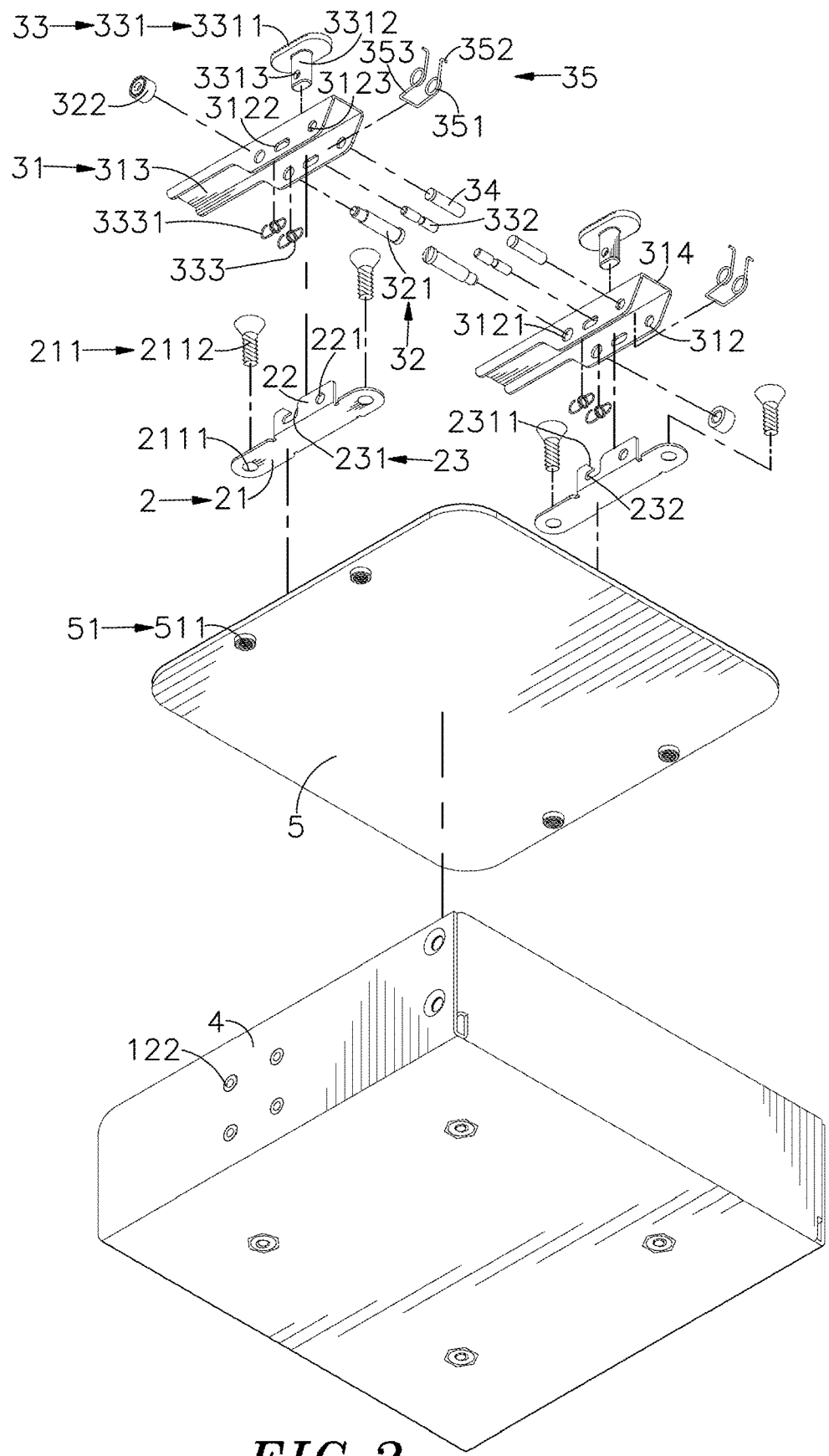
FIG. 3 is an exploded view of a locating device of the present invention, when viewed from another angle.
Figure 4:
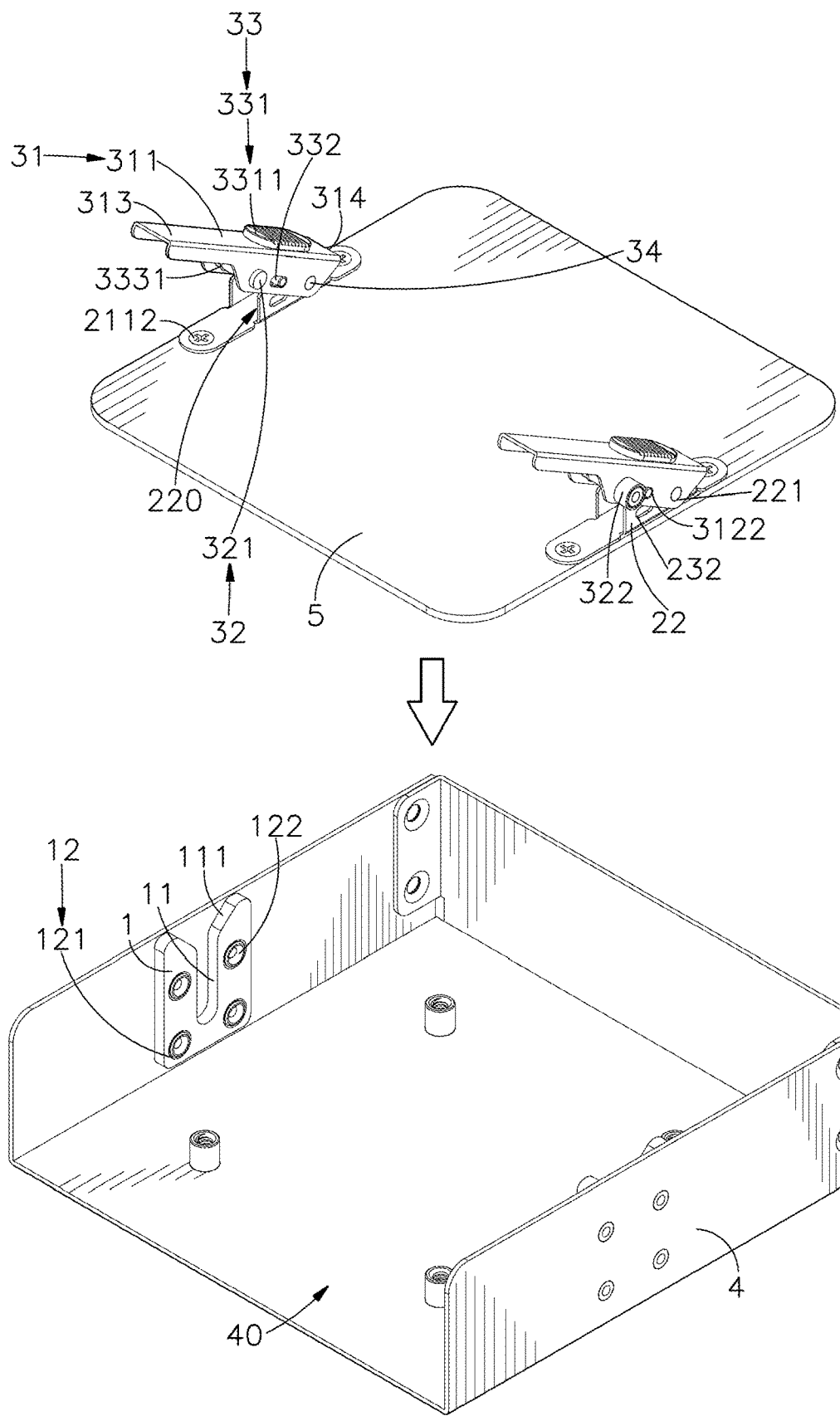
FIG. 4 is a perspective view of a combination member being placed into a main body, according to the present invention.
Figure 5:
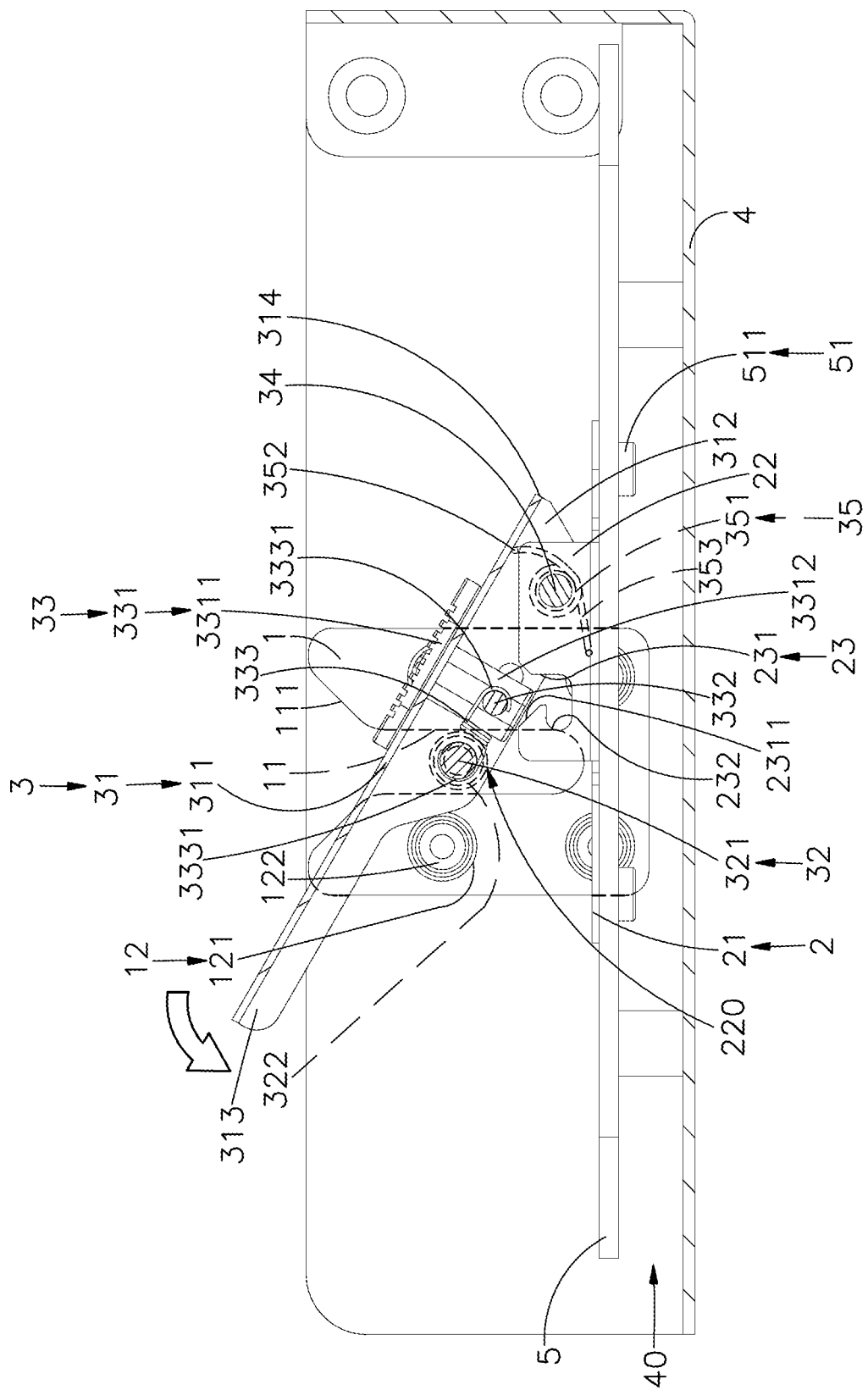
FIG. 5 is a first sectional side view of a locating device being operated, according to the present invention.
Figure 6:
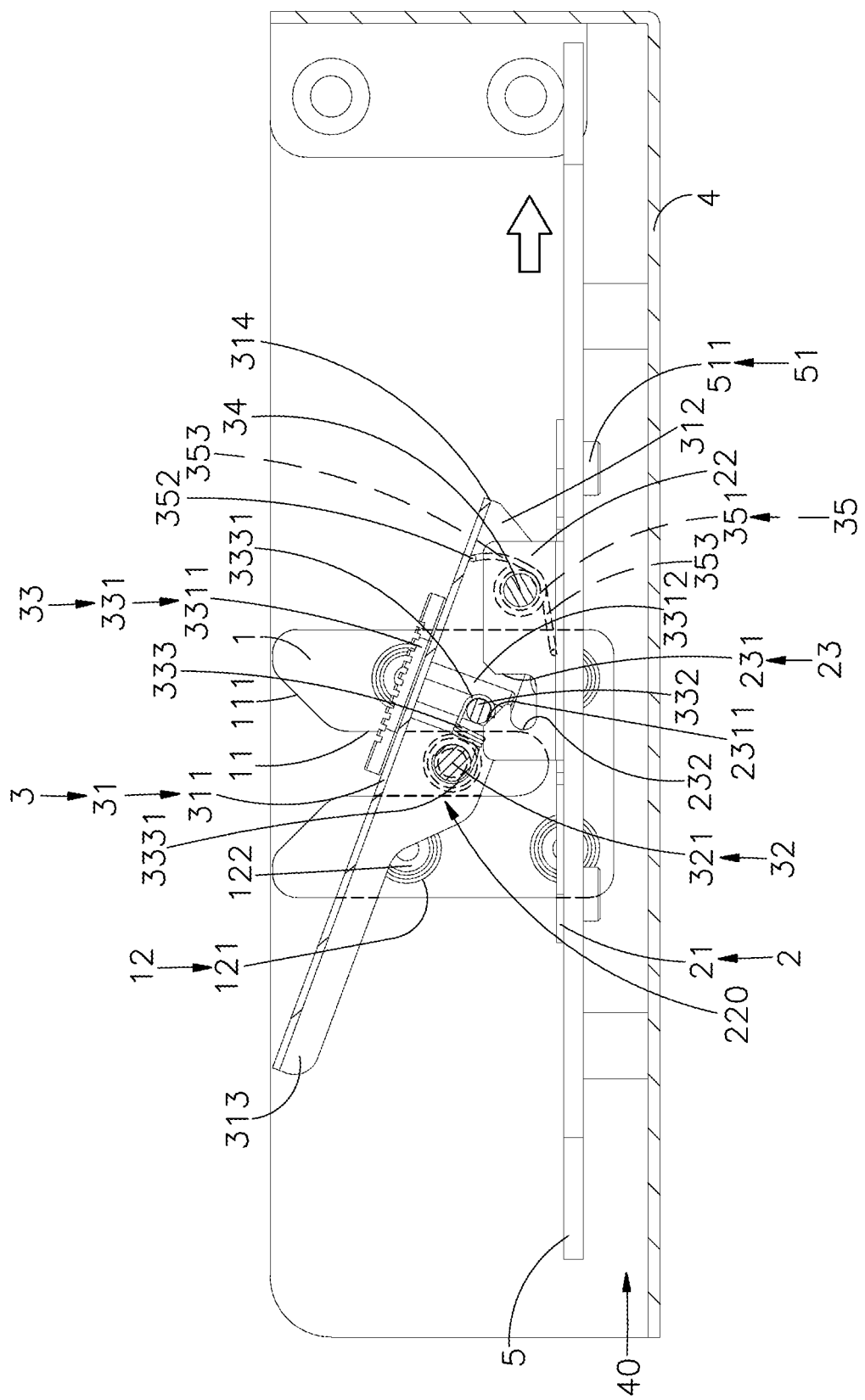
FIG. 6 is a second sectional side view of a locating device being operated, according to the present invention.
Figure 7:
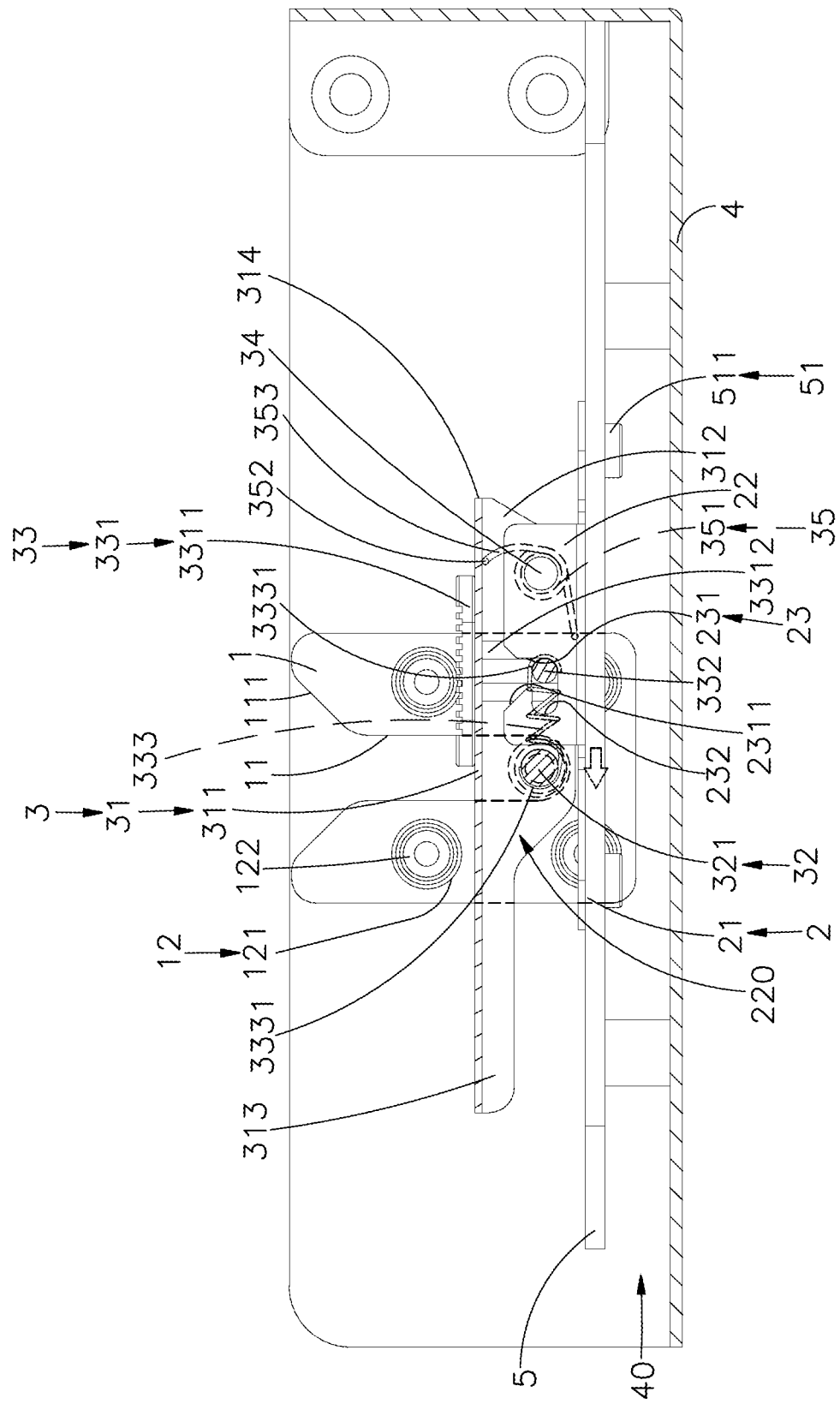
FIG. 7 is a third sectional side view of a locating device being operated, according to the present invention.

Please refer to FIGS. 1 to 3, which are an elevational view, an exploded view and another exploded view of a locating device of the present invention. As shown in FIGS. 1 to 3, the locating device of the present invention includes a guiding member 1, a sliding member 2 and a pulling assembly 3.

The guiding member 1 has a U-shaped guiding channel 11 inwardly cut through a top thereof, and a guiding surface 111 formed on a top of the guiding channel 11 and inwardly inclined. The guiding member 1 has a fastening part 12 disposed on a surface thereof, and the fastening part 12 has a plurality of fastening holes 121 cut therethrough, and a plurality of fastening members 122 disposed inside the plurality of the fastening holes 121, respectively.

The sliding member 2 has a flat base 21, and the base 21 has a connection part 211 disposed on a surface thereof, and the connection part 211 has pass holes 2111 formed at a front side and a rear side of the base 21, and locking elements 2112 disposed inside the pass holes 2111, respectively. The sliding member 2 has side plates 22 formed on two other sides thereof opposite to the connection part 211 and bent in the same direction, and an accommodation space 220 formed between two side plates 22, and each side plate 22 has a through hole 221 cut through a rear part thereof, and a locating part 23 formed thereon. Each locating part 23 has a sliding groove 231 longitudinally cut therethrough, and a guiding incline 2311 formed on a side of an opening of the sliding groove 231 and inwardly and downwardly inclined, and a locating groove 232 formed on and horizontally cut through a bottom of the sliding groove 231.

The pulling assembly 3 includes a pulling body 31, and a base part 311 of the pulling body 31 has a pass hole 3111 cut through a surface thereof, and two plates 312 bent from two opposite sides thereof and in the same direction, and each plate 312 has a hole 3121, a sliding hole 3122 and a shaft hole 3123 disposed from a front part to a rear part thereof and cut through a surface thereof. The pulling body 31 has a pulling member 313 outwardly extended from a front part thereof, and a supporting surface 314 protruded on a rear part thereof. A guiding rod 321 of a guiding element 32 is inserted through the two holes 3121, and a rotatable wheel 322 is pivotally connected to at least one end of the guiding rod 321. The pulling assembly 3 has a fastening element 33 disposed on a side of the pulling body 31 opposite to the guiding element 32. The fastening element 33 has a sliding block 331 disposed in the pass hole 3111 of the base part 311 and slidable back and forth, and the sliding block 331 has a sliding plate 3311 disposed on a surface of the base part 311, and a protruding pin 3312 downwardly extended from a bottom surface of the sliding plate 3311 and inserted into the pass hole 3111, and a joint hole 3313 horizontally cut through the protruding pin 3312. A fastening pin 332 is disposed inside the joint hole 3313, and two ends of the fastening pin 332 are slidable and movable in the sliding hole 3122. An elastic element 333 is disposed and linked between the fastening pin 332 and the guiding rod 321. Two ends of the elastic element 333 are bent and extend to form hook parts 3331 for hooking the fastening pin 332 and the guiding rod 321, respectively. A shaft pin 34 is inserted into the two shaft holes 3123, and a torsion spring 35 is mounted on the shaft pin 34 and disposed between the two plates 312. The torsion spring 35 is wound to form two mounting holes 351 for mounting the shaft pin 34, and the torsion spring 35 has first abutting parts 352 extended from ends of two mounting holes 351 and configured to abut with a bottom surface of the base part 311 of the pulling body 31, and other ends of the two mounting holes 351 are connected to form a second abutting part 353 which is in an inverted-U shape.

Please refer to FIGS. 4 to 9, which are a perspective view when a combination member is placed in the main body, and first to fifth sectional side views of the locating device being operated, according to the present invention. As shown in FIGS. 4 to 9, during the assembly process, the guiding member 1 can be mounted on at least one side wall of a receiving space 40 of an external main body 4, and the guiding member 1 is riveted for fastening by the fastening member 122 of the fastening part 12, so that the guiding member 1 can be stably located on the side wall of the external main body 4. The pulling assembly 3 can be disposed on the sliding member 2. The torsion spring 35 of the pulling assembly 3 can be placed into the accommodation space 220 between the two side plates 22 first, and the two plates 312 of the pulling body 31 of the pulling assembly 3 can cover the outer sides of the two side plates 22 of the sliding member 2 corresponding thereto. The shaft pin 34 of the pulling assembly 3 can be inserted through the shaft holes 3123 of the two plates 312, two mounting holes 351 of the torsion spring 35, and through holes 221 of the two side plates 22, from a side, and then inserted out of the pulling body 31, thereby pivotally connecting the pulling assembly 3 on the sliding member 2. The first abutting parts 352 and the second abutting part 353 on two opposite sides of the torsion spring 35 can be abutted against the bottom surface of the base part 311 of the pulling body 31 and the surface of the base 21, respectively. After the sliding member 2 and the pulling assembly 3 are pivotally connected to each other, the sliding member 2 can be placed on the surface of an external combination member 5, and the two holes 2111 of the connection part 211 can be aligned to two locking holes 511 of a connection part 51 on the surface of the external combination member 5, and the plurality of locking elements 2112 can be inserted through the holes 2111 and locked into the locking holes 511, respectively, for fastening and locating, so that the sliding member 2 can be stably combined with the surface of the external combination member 5.

After the surface of the external combination member 5 is stably combined with the at least one sliding member 2, the pulling body 31 of the pulling assembly 3 can be upwardly pulled to rotate to form an open state, so that the supporting surface 314 of the pulling body 31 can be abutted against on the surface of the base 21 of the sliding member 2, thereby preventing the pulling body 31 from being excessively pulled to lost support force. The user can then hold the pulling member 313 of the pulling body 31 or the surface of the external combination member 5, to downwardly place the external combination member 5 into the receiving space 40 of the external main body 4, and at this time, the guiding element 32 of the pulling assembly 3 can be guided by the guiding surface 111 on the top of the guiding channel 11 of the guiding member 1, so that the guiding element 32 can smoothly enter the guiding channel 11. Next, the pulling body 31 of the pulling assembly 3 can be downwardly pulled, and the pulling body 31 can be rotated in the counter-clockwise direction about the shaft pin 34, and at this time, the guiding rod 321 of the guiding element 32 can be longitudinally and downwardly slid in the guiding channel 11, and the wheel 322 pivotally connected to an end of the guiding rod 321 can be rotated in the guiding channel 11, thereby improving sliding smoothness. During the longitudinal and downward sliding process of the guiding element 32 in the guiding channel 11, the sliding member 2 and the external combination member 5 are also simultaneously moved backwardly in a horizontal direction, and at the same time, the first abutting parts 352 and the second abutting part 353 of the two ends of the torsion spring 35 can be compressed to deform by the bottom surface of the base part 311 of the pulling body 31 and the surface of the base 21, and the fastening pin 332 of the fastening element 33 is inserted into the sliding groove 231 of the locating part 23, and guided to move along the guiding incline 2311 on the openings of the sliding groove 231. While the fastening pin 332 is moving along the guiding incline 2311, two ends of the fastening pin 332 can be slid in the two sliding holes 3122, and the fastening pin 332 can outwardly extend the hook part 3331 of an end of the elastic element 333, so as to extend the elastic element 333; the pulling body 31 can be continuously pulled downwardly to rotate until the fastening pin 332 is not in contact with the guiding incline 2311 of the sliding groove 231, and the elastic element 333 is then elastically recovered, so that the fastening pin 332 can be pulled back and located in the horizontal locating groove 232 on the bottom of the sliding groove 231, and the pulling body 31 of the pulling assembly 3 enters a locked state. As a result, after being backwardly and horizontally moved, the external combination member 5 can be stably located in the receiving space 40 of the external main body 4.

In order to open the pulling body 31 of the pulling assembly 3 to take out the external combination member 5, the user can backwardly push the sliding plate 3311 of the sliding block 331 of the fastening element 33, to simultaneously move the fastening pin 332 backwardly for releasing the fastening pin 332 from constraint of the locating groove 232 of the locating part 23, so as to unlock the fastening pin 332. Next, the user can pull the pulling member 313 of the pulling body 31 to upwardly rotate, to rotate the pulling body 31 in the clockwise direction, and the guiding element 32 of the pulling assembly 3 can be slid upwardly and longitudinally in the guiding channel 11 of the guiding member 1, and also simultaneously move the sliding member 2 and the external combination member 5 forwardly and horizontally, and the fastening pin 332 can be moved in the sliding groove 231 of the locating part 23 longitudinally and upwardly, and at this time, the user can directly pull the pulling body 31 upwardly to separate the guiding element 32 of the pulling assembly 3 from the guiding channel 11 of the guiding member 1, so that the external combination member 5 can be taken out from the receiving space 40 of the external main body 4. According to above contents, the user can easily assemble or use the locating device of the present invention.

Preferably, the sliding member 2 can be combined on the surface of the external combination member 5 by a locking manner; however, in actual application, the sliding member 2 can also be combined with the external combination member 5 by riveting or SMT manner. It should be noted that there are various available manners of combining the sliding member 2 and the external combination member 5, so the structure applied in the present invention to achieve above-mentioned effect should be covered by spirit and scope of the disclosure, and numerous modifications, variations and enhancements with equivalent effect can be made thereto by those skilled in the art without departing from the spirit and scope of the disclosure set forth in the claims.

Furthermore, the displacement distance of the sliding member 2 when the pulling assembly 3 is in the locked state, can be calculated by subtracting a distance between the shaft pin 34 and the guiding channel 11 of the guiding member 1, from the distance between the shaft pin 34 of the pulling assembly 3 and the guiding element 32, when the pulling assembly 3 is in the open state. As a result, the displacement distance of the sliding member 2 can be adjusted by merely increasing or decreasing the distance between the shaft pin 34 and the guiding element 32.

However, the external main body 4 can be a server chassis, a host computer, a storage or telecommunication cabinet or other object for accommodation and receiving, and the external combination member 5 can be a server hard disk, a CD/DVD-ROM drive, a burning machine, a circuit board, or an object which can be mounted on the external main body 4.

Furthermore, in a preferred embodiment, the guiding member 1 can be mounted on the side wall of the external main body 4, to provide the guiding element 32 of the pulling assembly 3 to slide; however, in actual application, the side wall of the external main body 4 can be directly stamped to form the shape of the guiding channel 11 of the guiding member 1. It should be noted that there are various manners of forming the guiding channel 11 of the guiding member 1 on the side wall of the external main body 4, so the structure applied in the present invention to achieve above-mentioned effect should be covered by spirit and scope of the disclosure, and numerous modifications, variations and enhancements with equivalent effect can be made thereto by those skilled in the art without departing from the spirit and scope of the disclosure set forth in the claims.

Figure 8:
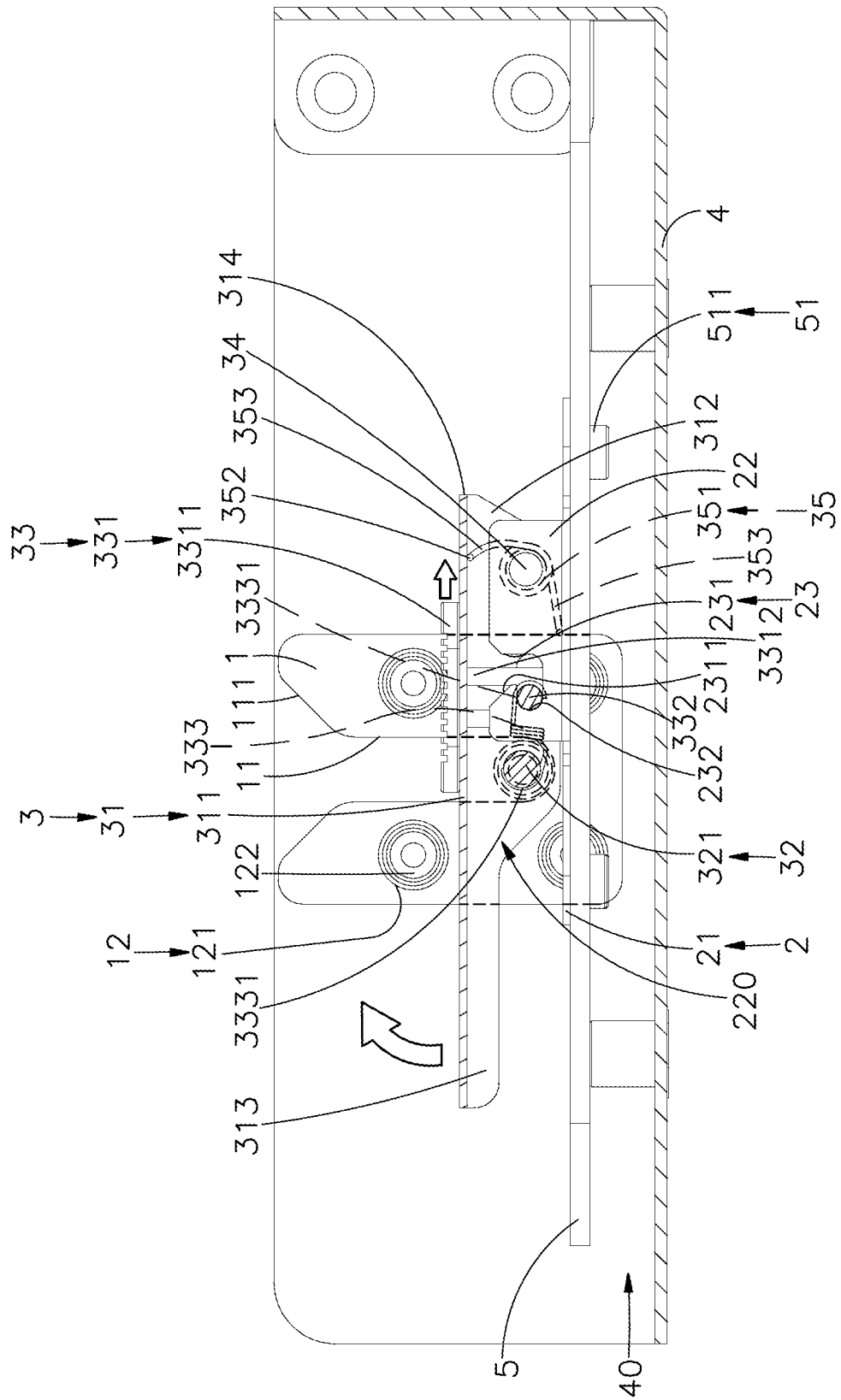
FIG. 8 is a fourth sectional side view of a locating device being operated, according to the present invention.
Figure 9:
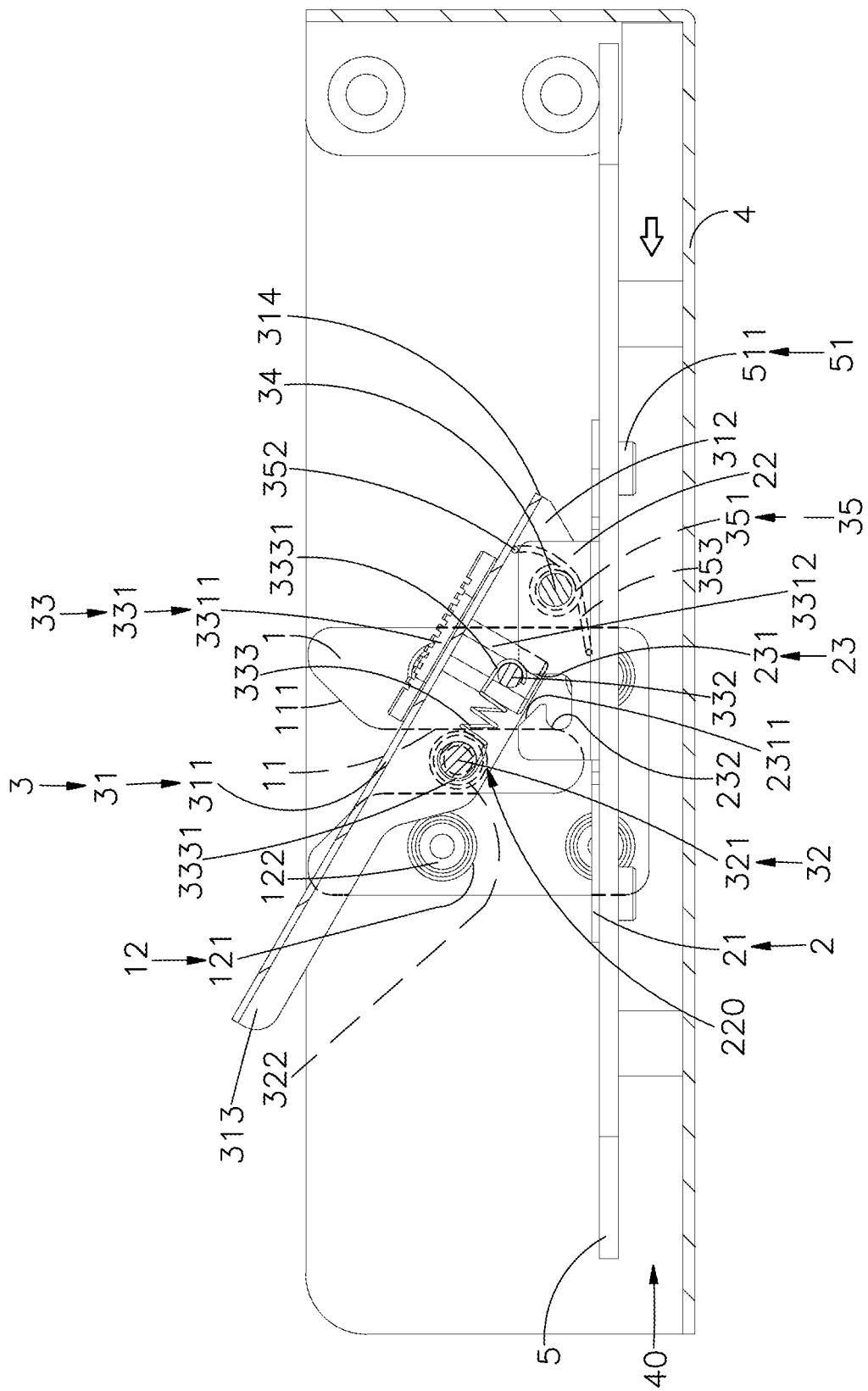
FIG. 9 is a fifth sectional side view of a locating device being operated, according to the present invention.
Figure 10:
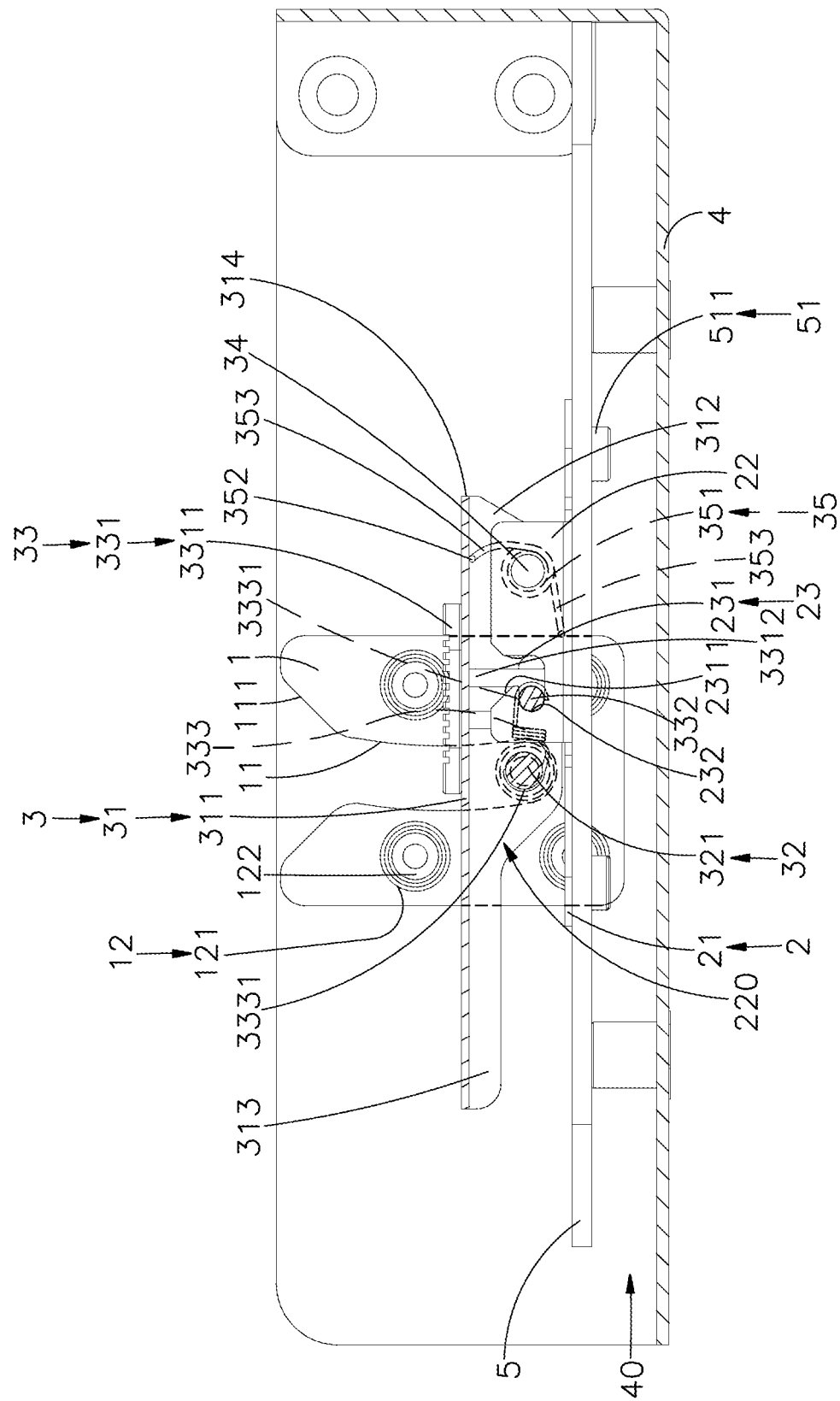
FIG. 10 is a sectional side view of another embodiment of a locating device being operated, according to the present invention.

Please refer to FIGS. 8 and 10, which are the fourth sectional side view of a locating device being operated, and a sectional side view of another embodiment of a locating device being operated, according to the present invention. As shown in FIGS. 8 and 10, in a preferred embodiment of FIG. 8, the guiding channel 11 of the guiding member 1 is longitudinally and downwardly cut through the guiding member 1; however, in actual application, such as another embodiment shown in FIG. 10, the guiding channel 11 of the guiding member 1 of another embodiment is arch-shaped, and while the pulling body 31 of the pulling assembly 3 is being pushed to rotate downwardly, the guiding element 32 of the pulling assembly 3 is slid along the arch-shaped guiding channel 11, and the sliding member 2 can be moved back and forth along the guiding channel 11, so that the external combination member 5 can be moved in different direction according to the shape of the guiding channel 11.

According above-mentioned contents, the locating device of the present invention has advantages below.

First, when the pulling body 31 of the pulling assembly 3 is pulled to rotate, the guiding element 32 can be guided and slid in the guiding channel 11 of the guiding member 1, and the sliding member 2 is also simultaneously moved in another direction opposite to the sliding direction of the guiding element 32, and after the pulling body 31 of the pulling assembly 3 is pulled, the fastening element 33 of the pulling assembly 3 can be located on the locating part 23 of the sliding member 2 to lock the pulling assembly 3, so that it is not necessary to perform complicated assembly operation using screw to lock, thereby reducing operational difficulty and achieving the effect of improving assembly speed.

Secondly, when the pulling body 31 of the pulling assembly 3 is pulled to downwardly rotate, the fastening element 33 can directly fasten and lock the fastening pin 332 in the locating groove 232 of the locating part 23 of the sliding member 2, by the elastic element 333, so that the user can directly lock the pulling assembly 3 by using the one-time downward pulling operation of the present invention without additional fastening operation, thereby achieving the effects of simple operation and higher operation assembly speed.

Thirdly, when the pulling body 31 of the pulling assembly 3 is in the open state, the pulling body 31 can abut against the surface of the base 21 of the sliding member 2 by the supporting surface 314 thereof, to prevent the pulling body 31 from being excessively pulled to lost support force, and further prevent the external combination member 5 from shaking during the assembly process, so that the guiding element 32 of the pulling assembly 3 can be accurately inserted into the guiding channel 11 of the guiding member 1, thereby improving accuracy and stability of assembly process.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A locating device, comprising: a guiding member comprising a guiding channel inwardly cut through a top thereof; a sliding member comprising a base, a connection part formed on a surface thereof and configured to combine with a preset combination member, and two side plates formed on two other sides thereof opposite to the connection part and bent in the same direction, respectively, wherein each of the two side plates comprises a locating part; a pulling assembly comprising a pulling body pivotally connected to the sliding member, and a guiding element disposed on the pulling body and configured to slide and move in the guiding channel, and a fastening element disposed on a side of the pulling body opposite to the guiding element and configured to locate on the locating parts, wherein in a condition that the pulling body of the pulling assembly is in an open state and the fastening element is not located on the locating parts, when the pulling body of the pulling assembly performs a locking operation, the guiding element is slid in the guiding channel of the guiding member and the sliding member is simultaneously moved in another direction opposite to a sliding direction of the guiding element, and when the pulling body of the pulling assembly is in a locked state, the fastening element is located on the locating parts of the sliding member.

2. The locating device according to claim 1, wherein the guiding channel of the guiding member comprises a guiding surface formed on a top thereof and inwardly inclined.

3. The locating device according to claim 1, wherein the guiding channel cut through the guiding member is longitudinal, and when the pulling body of the pulling assembly performs the locking operation, the guiding element is longitudinally slid in the guiding channel of the guiding member and the sliding member is horizontally moved simultaneously.

4. The locating device according to claim 1, wherein the sliding member comprises an accommodation space formed between the two side plates thereof, and each of the two side plates has a through hole cut through a rear part thereof, and the pulling body comprises a base part, and two plates bent from two opposite sides of the base part in the same direction and configured to cover outer sides of the two side plates, and each of the two plates comprises a shaft hole cut through a surface thereof, and the pulling assembly comprises a shaft pin inserted through the two shaft holes and two through holes, and a torsion spring mounted on the shaft pin, disposed inside the accommodation space and configured to abut against between the base and the base part.

5. The locating device according to claim 4, wherein the torsion spring is wound to form two mounting holes for mounting the shaft pin, and the torsion spring comprises a first abutting part extended from ends thereof and configured to abut against a bottom surface of the base part of the pulling body, and a second abutting part formed by other ends of the two mounting holes connected with each other and configured to abut against a bottom surface of the base, wherein the second abutting part is in an inverted-U shape.

6. The locating device according to claim 1, wherein the locating part of the sliding member comprises a sliding groove longitudinally cut therethrough, and a guiding incline formed on an opening of the sliding groove and inwardly and downwardly inclined, and a locating groove formed on and horizontally cut through a bottom of the sliding groove, and the pulling body comprises a base part, and the base part comprises a pass hole cut through a surface thereof, and two plates bent from two opposite sides thereof and in the same direction, and each of the two plates comprises a sliding hole cut through a surface thereof, the fastening element comprises a sliding block disposed in the pass hole of the base part and slidable back and forth, and the sliding block comprises a sliding plate disposed on a surface of the base part, and a protruding pin downwardly extended from a bottom surface of the sliding plate and inserted into the pass hole, the protruding pin comprises a joint hole horizontally cut therethrough, and the fastening element comprises a fastening pin disposed inside the joint hole, and when the pulling body of the pulling assembly performs the locking operation, the two ends of the fastening pin are slid and moved inside the sliding hole, and the fastening pin is slid in the sliding groove along the guiding incline, and when the pulling body of the pulling assembly is in the locked state, the fastening pin is located in the locating groove.

7. The locating device according to claim 1, wherein the pulling body comprises a base part, and the base part comprises two plates bent from two opposite sides thereof in the same direction, and each of the two plates comprises a hole cut through a surface thereof, and the guiding element comprises a guiding rod inserted through the two holes, and the guiding element comprises a wheel pivotally connected to at least one end of the guiding rod and slidable and rotatable in the guiding channel.

8. The locating device according to claim 1, wherein the pulling body of the pulling assembly comprises a pulling member outwardly extended from a front part thereof, and a supporting surface protruded from a rear part thereof and configured to abut against the base in the open state.

9. The locating device according to claim 1, wherein the pulling assembly comprises an elastic element linked between the guiding element and the fastening element, and two ends of the elastic element are bent and extended to form hook parts for hooking the guiding element and the fastening element, respectively.

10. A locating device, comprising: a sliding member comprising a base, and a connection part formed on a surface of the base and configured to combine with a preset combination member, and side plates formed on two other sides of the base opposite to the connection part and bent in the same direction, wherein each of the two side plates comprises a locating part disposed thereon; and a pulling assembly comprising a pulling body pivotally connected to the sliding member, and a guiding element disposed on the pulling body, wherein the pulling body comprises a fastening element formed on a side opposite to the guiding element and configured to locate on the locating parts when the pulling assembly is in a locked state; when the pulling body of the pulling assembly performs a locking operation, the guiding element is slid in a guiding channel of a guiding member and the sliding member is simultaneously moved in another direction opposite to a sliding direction of the guiding element.

* * * * *